United States Patent [19]

Nakagawa et al.

[11] Patent Number: 4,481,426

[45] Date of Patent: Nov. 6, 1984

[54] SIGNAL TRANSMITTING SYSTEM HAVING SPURIOUS RADIATION PREVENTING FUNCTION

[75] Inventors: Katsuya Nakagawa, Osaka; Satoshi Yamato, Shiga, both of Japan

[73] Assignee: Nintendo Co., Ltd., Osaka, Japan

[21] Appl. No.: 451,008

[22] Filed: Dec. 20, 1982

[51] Int. Cl.³ .......................... H03K 5/00; H04B 3/28
[52] U.S. Cl. .................................... 307/91; 307/108; 307/109; 307/268; 361/111; 361/395; 361/399; 388/164; 315/85
[58] Field of Search ............... 328/164; 361/110, 111, 361/424, 395, 399; 307/94, 104, 105, 108, 109, 263, 268; 315/85

[56] References Cited

U.S. PATENT DOCUMENTS

| | | | |
|---|---|---|---|
| 3,504,188 | 3/1970 | Ficker | 361/424 X |
| 3,657,568 | 4/1972 | Dargent | 307/268 |
| 3,778,642 | 12/1973 | Frame | 328/164 X |
| 3,994,853 | 3/1976 | Looper | 307/268 X |
| 4,041,364 | 8/1977 | Gauper, Jr. | 307/91 X |

Primary Examiner—A. D. Pellinen
Assistant Examiner—Derek S. Jennings
Attorney, Agent, or Firm—W. G. Fasse; D. H. Kane, Jr.

[57] ABSTRACT

A signal transmitting system including a spurious radiation preventing circuit which comprises a differentiating circuit coupled to a signal line connected to a signal source for differentiating an original signal for emphasizing high frequency components of the signal, an adder circuit for adding the output from the differentiating circuit and the original signal, and a current booster for boosting the output from the adder circuit. The output from the current booster is applied to an output device through a high cut filter, so that spurious radiation from the signal line connecting the signal source with the output device is reduced.

4 Claims, 13 Drawing Figures

SIGNAL TRANSMITTING SYSTEM HAVING SPURIOUS RADIATION PREVENTING FUNCTION

BACKGROUND OF THE INVENTION

1. Field of the Invention

The present invention relates to a signal transmitting system. More particularly, the present invention relates to a system for transmitting a signal having relatively high frequency components wherein a spurious radiation from the signal source can be effectively attenuated.

2. Description of the Prior Art

Figure 1:
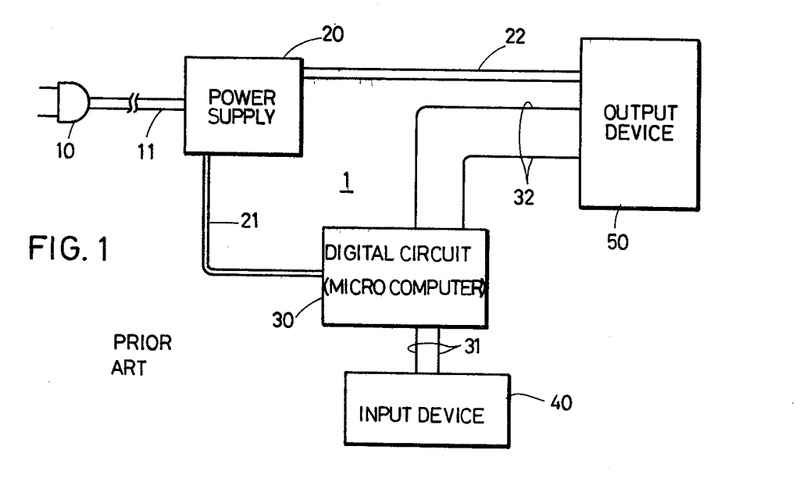
FIG. 1 is a schematic block diagram showing an example of an apparatus that utilizes a microcomputer as in the background of the present invention.

FIG. 1 is a schematic block diagram showing a general hardware structure of a product utilizing a microcomputer, for illustrating the background of the present invention. This apparatus 1 comprises a power supply circuit 20 connected to an alternating current power source, such as commercial power line, through a plug 10 and a power source line 11. The power supply circuit 20 comprises a well-known voltage transforming means (transformer), a direct current power supply circuit and the like, not shown. The circuit 20 supplies direct current power to a power source line 21 and it also supplies alternating current to a power source line 22. Power on line 21 operates a digital circuit 30. The digital circuit 30 comprises a circuit board (not shown) on which a microcomputer and an associated circuit are mounted. As is well known, the microcomputer includes a combination of a read only memory (ROM), a random access memory (RAM), an arithmetic logic unit (ALU) and an I/O port. An input port of the digital circuit (microcomputer) 30 is connected to an input device 40 through a signal line 31. The input device 40 comprises a keyboard, a manual switch and the like to apply their operation signal (ON/OFF signal) to the digital circuit (microcomputer) 30 as an input signal. An output port of the digital circuit 30 applies an output signal (for example, a digital signal and or analog signal such as a video signal) to an output device 50 through the signal line 32. The output device 50 includes a cathode ray tube (CRT) display and a sound circuit, not shown, to output a picture or a sound in response to a signal applied from the digital circuit 30 through the signal line 32.

The digital apparatuses as shown in FIG. 1, particular, products utilizing a microcomputer, are widespread and are even used in the home already. However, a spurious radiation of electromagnetic waves generated by sucn digital circuits has caused certain problems. More particularly, with an increase in the processing speed in a recent microcomputer and the high speed of electronic circuits, a spurious electromagnetic wave of up to several hundred MHz above an audio frequency is radiated into the air by various dividing signals and higher harmonic components with respect to a basic frequency of several HMz. Accordingly, on the grounds that such spurious radiation interferes with general radio communication or is an obstacle to commercial communication such as television broadcasting, considerably strict restrictions to such spurious radiation will be enacted in many countries, for example, by the FCC and the FTZ.

Conventionally, some approaches are known for preventing spurious radiation in the apparatus shown in FIG. 1, for example. One approach is to house a circuit board (on which a microcomputer is mounted) which serves as a signal source in a shielded casing. However, if only such a signal source is housed in a shielded casing, there is almost no effect because a power supply line and a signal line all act as antennas if and when a power supply and input-output devices are connected to the signal source. Another approach is to house all of the power supply circuits and other apparatuses in a shielded casing. However, if a power supply circuit and other apparatuses are all housed in a shielded casing, the mechanism becomes complicated and large in size. Hence, the cost thereof becomes too expensive, and the work efficiency is remarkably decreased. Therefore, the following approaches are proposed as further approaches for a power source line and a signal line that are necessarily exposed from the shielded casing to the exterior. That is, such approaches are, for example, to bypass high frequency components by making the signal line pass through a feed-through capacitor or to relay such a signal line by using a connector, having a special bypass capacitor, for removing high frequency components. However, in accordance with such approach attempting to prevent spurious radiation by removing such high frequency components, a necessary information signal is adversely affected by such a feed-through capacitor and special connector, and hence, there has been a problem in that the quality of, for example, video signals and other synchronization signals or clock signals are remarkably deteriorated. In addition, a frequency spectrum which is to prevent spurious radiation must be as widely spread as described in the foregoing and the number of required signal lines differs widely depending on the situation. For this reason, there are few components suitable for this purpose, which causes a further cost increase. Furthermore, although the power source line and signal line are shielded by a metal pipe or a special shielded cable, such an approach using a metal pipe or a shielded cable causes a decrease of work efficiency and an increased cost.

SUMMARY OF THE INVENTION

Accordingly, a principal object of the present invention is to provide an improved signal transmitting system capable of effectively preventing spurious radiation without causing any decrease of work efficiency or adversely affecting mass production requirements and also without causing any deterioration of the quality of a required signal.

Briefly stated, the present invention is directed to a signal transmitting system wherein high frequency components of a signal to be transmitted are emphasized in advance prior to transmittal and a high frequency component in the emphasized signal is attenuated, so that a spurious radiation component, that is, a spurious high frequency component is largely attenuated.

In accordance with the present invention, the quality of the original signal is not reduced and spurious radiation can be effectively prevented since high frequency components are emphasized in advance of their transmittal and thereafter the emphasized high frequency components are attenuated by high frequency attenuating means, together with the spurious components.

In an embodiment of the present invention, signal lines for transmitting an ON/OFF signal, such as a switching signal, to or from a signal processing circuit comprising a high frequency signal source, are always coupled to a reference potential, such as ground in terms of alternating current, irrespective of the ON or OFF state of a signal.

In accordance with the embodiment, a spurious signal component from a signal processing circuit is never radiated from a signal line since the ON/OFF signal is supplied to a signal processing circuit including a high frequency signal source or a signal line for withdrawing therefrom is connected to a reference voltage in terms of alternating current, irrespective of the ON or OFF state of a signal. In addition to this, the structure is simplified and any decreases in mass productivity and work efficiency can be avoided.

In another embodiment of the present invention, a shielded casing and a printed circuit board covering an opening of the shielded casing are included and a circuit for preventing spurious radiation is wired and mounted on or attached to the printed board.

In accordance with another embodiment, since a spurious radiation preventing circuit is adapted to be attached to a printed circuit board covering an opening of a shielded casing, it is not necessary to redesign the circuit to prevent spurious radiation even if a specification of the electronic circuit housed in the shielded casing is changed, and hence an excellent mass productivity can be obtained. In addition, since spurious radiation is almost perfectly reduced by such a spurious radiation preventing circuit and by a shielded casing (a printed board), it is not necessary to use a combination of a shielded casing and a metal pipe and hence an extremely good work efficiency is obtained.

These objects and other objects, features, aspects and advantages of the present invention will become clear from the following detailed description of the present invention when taken in conjunction with the accompanying drawings.

BRIEF DESCRIPTION OF THE DRAWINGS

FIGS. 7 to 10 show the intensity of radiated electric fields to a frequency, respectively, wherein FIGS. 7 and 9 show the cases where no countermeasure to spurious radiation is taken whereas FIGS. 8 and 10 show the cases in which a counter measure to spurious radiation in accordance with the present invention is taken;

DESCRIPTION OF THE PREFERRED EMBODIMENTS

Figure 2:
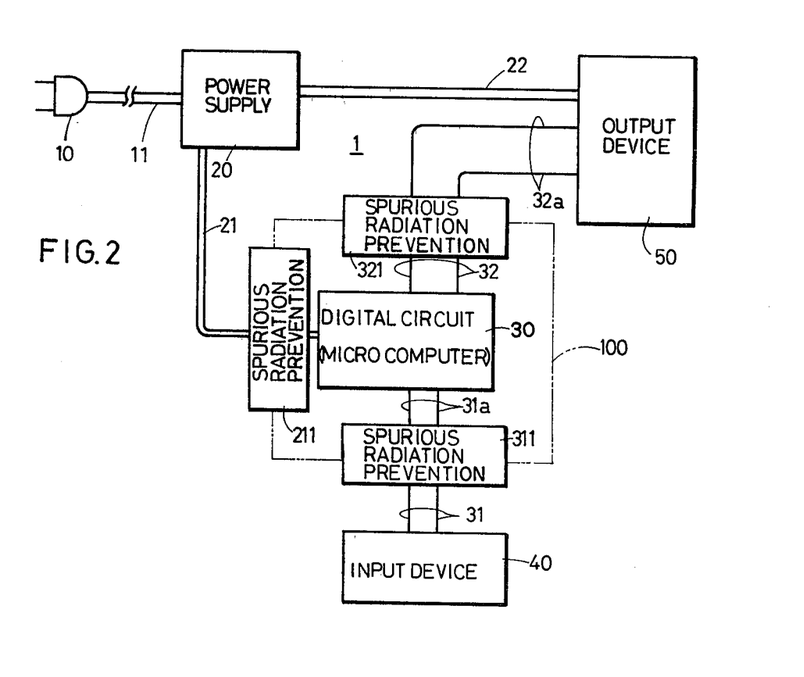
FIG. 2 is a schematic block diagram showing an embodiment of the present invention.
Figure 3:
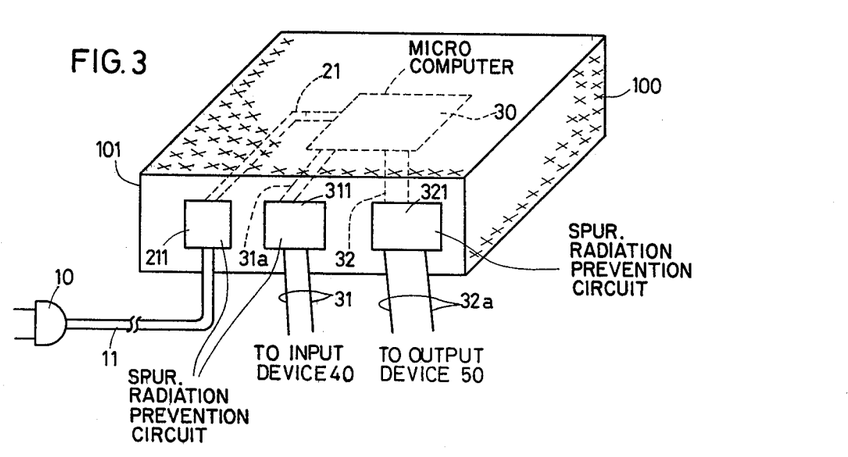
FIG. 3 is a diagrammatic view of an external appearance showing an example of a shielded casing in accordance with the embodiment of FIG. 2.

FIG. 2 is a schematic block diagram showing an embodiment of the present invention. In its structure, the present embodiment is the same as the previous FIG. 1 embodiment except for the following points, and therefore, for the purpose of avoiding a duplicate description, the description of the same portions is omitted. A digital circuit 30 such as a microcomputer is housed in a shielded casing 100 as shown in FIG. 3. The shielded casing 100 is in the shape of a rectangular parallelepiped, for example, and is made of a mesh-like metal box, one side of which is opened. The opening is covered by a printed circuit board 101. On the printed board 101, spurious radiation preventing circuits 211, 311 and 321 are formed which are shown in FIG. 2 and described with reference to FIGS. 4 and 6. A well-known feed-through capacitor and a special connector may be used as the spurious radiation preventing circuit 211 connected to a direct current source line 21 of a power supply circuit 20. Such a capacitor and connector form an output impedance of the source line 21 as viewed from the signal source (microcomputer), and hence, even conventional feed-through capacitors or the like can effectively prevent feeding of a spurious electromagnetic wave to these source lines 21 from said signal source.

The spurious radiation preventing circuits 311 and 321 comprise active elements such as transistors and passive elements such as resistors, capacitors and the like, as described subsequently, and are structured on the printed circuit board 101. Accordingly, the printed board 101 comprises a printed pattern necessary for respective circuits, which is not shown in the FIGS. The printed board 101 is preferably a two-sided board and it may be assumed that excess copper film or foil is left as wide as possible in the portions other than the pattern necessary for the circuit wiring. As a result, a further shielding effect can be obtained by a cooperation of the shielded casing 100 and the printed board 101.

The spurious radiation preventing circuit 311 is connected to the signal line 31 from the input device and a signal line 31a is connected between the circuit 311 and an input port of the digital circuit 30 within the shielded casing 100. The spurious radiation preventing circuit 321 is connected to a signal line 32 from an output port of the digital circuit 30 and a signal line 32a is connected between the circuit 321 and the output device 50. More particularly, the spurious radiation preventing circuits 311 and 321 are, respectively, interposed between the signal lines 31 and 31a and between the signal lines 32 and 32a to operate so that spurious high frequency components are not fed to each of signal lines in a subsequently described manner.

As taught herein, to prevent a spurious radiation, it is not necessary to implement a specific design for a digital circuit housed in the shielded casing 100, by providing a spurious radiation preventing circuit on the printed circuit board 101 cooperating with the shielded casing 100. More particularly, even if the number of the signal lines 31, 32, and the like, from the digital circuit housed in the shielded casing 100 increases or decreases, spurious radiation can be effectively prevented by cooperation of the shielded casing 100 with the printed board 101 by merely increasing or decreasing the number of these circuits 311, 321 correspondingly. Accordingly, even if there are many signal lines, there is no problem as to design, work efficiency and mass productivity.

In the following, the spurious radiation preventing circuits 311 and 321 will be described in detail.

Figure 4:
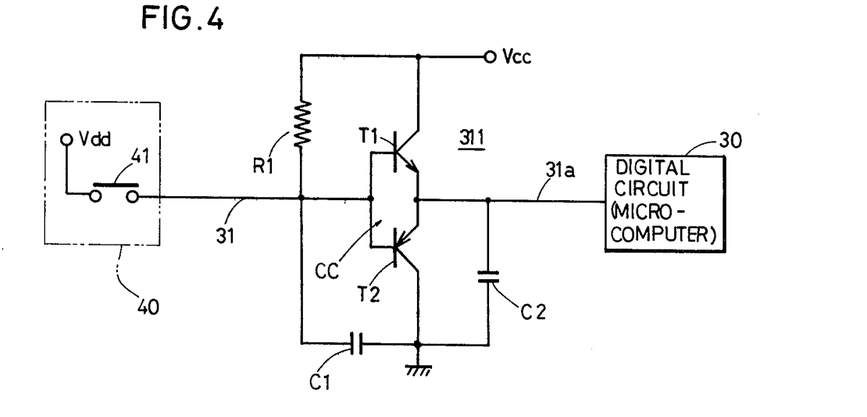
FIG. 4 is a circuit diagram of an essential part showing a preferred example of a spurious radiation preventing circuit 311.

FIG. 4 is a circuit diagram of an essential part showing a preferred embodiment of the spurious radiation preventing circuit 311. The input device 40 comprises a manually operable switch 41, for example. One end of the switch 41 is connected to a low level voltage and thus, in response to the ON or OFF signal of the switch 41, a low level or a high level signal (ON/OFF signal) is withdrawn to the signal line 31. The signal line 31 is connected to the signal line 31a through a complementary circuit CC included in a spurious radiation preventing circuit 321. The signal line 31a is connected to an input port of the digital circuit or microcomputer 30. The signal line 31a is grounded through a capacitor C2. The complementary circuit CC includes a complementary connection of an NPN transistor T1 with a PNP transistor T2, the collector of the transistor T1 being connected to a power source Vcc and the collector of the transistor T2 being connected to the ground. The bases of the transistors T1 and T2 are commonly connected to the signal line 31 and the emitters thereof are commonly connected to the signal line 31a. Meanwhile, the bases of the transistors T1 and T2 are commonly connected to the ground through a chatter preventing capacitor C1 and are also connected to the power source Vcc through a resistor R1 for normally pulling the line 31 up to a high level. The capacitor C2 is used for preventing an overshoot.

In operation, since the signal line 31 is usually pulled up to the power source Vcc through the resistor R1, one transistor T1 in the complementary circuit CC is rendered conductive. Therefore, the signal line 31a is connected to a power source Vcc and hence a high level signal is obtained there. If and when the switch 41 is turned on, the signal line 31 is forced to be in a low level and hence the other transistor T2 in the complementary circuit CC is rendered conductive. As a result, the signal line 31a is connected to the ground through the transistor T2 and hence the low level signal is obtained there. In such a way, in response to the ON or OFF signal of the switch 41, the low level or high level signal is applied to the input port of the digital circuit 30 through the signal line 31, the spurious radiation preventing circuit 311, that is, the complementary circuit CC and the signal line 31a. The digital circuit 30 performs a predetermined processing operation in response to such an applied ON/OFF signal.

The digital circuit 30 operates as a signal source for spurious radiation components, with respect to the signal line connected to the input port of the digital circuit 30, just like the signal line 31. More particularly, the digital circuit or microcomputer comprises an operating clock of 64 kHz, for example, and thus, if such a circuit 311 is not provided, such operating clock or the lower order or higher order harmonic components thereof are radiated to the exterior through the signal line 31. In the embodiment of FIG. 4, since in a normal state one transistor T1 constituting the complementary circuit CC is rendered conductive as described in the foregoing, the signal line 31a is connected to the power source (reference potential) Vcc. Accordingly, the spurious radiation components fed to the signal line 31a from the digital circuit 30 are drawn to the ground, in terms of alternating current, through the transistor T1. Even in the case in which the signal line 31 reaches the low level, the transistor T2 is rendered conductive and hence the signal line 31a is grounded, in terms of alternating current. Thus, the spurious signal components fed to the signal line 31a from the digital circuit 30 can be effectively prevented from being radiated to the exterior, primarily by the transistors T1 and T2 included in the complementary circuit CC and secondarily by the capacitors C1 and C2.

Figure 5:
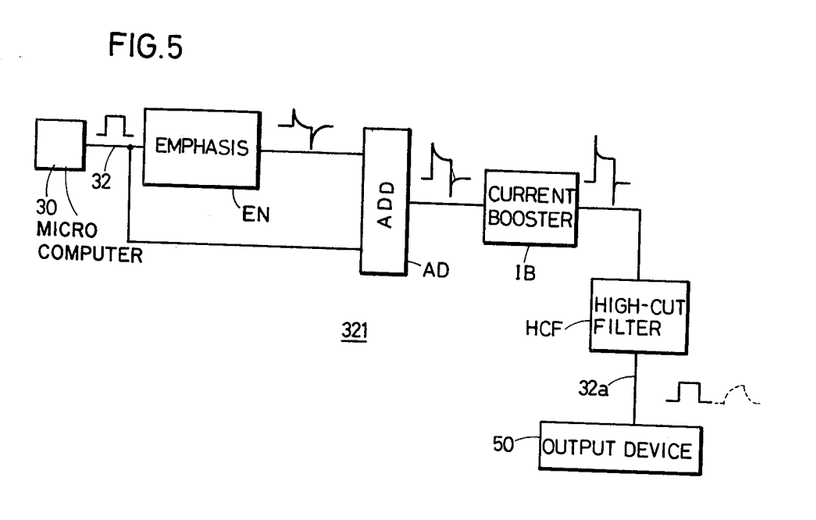
FIG. 5 is a schematic block diagram showing an example of a spurious radiation preventing circuit 321.

FIG. 5 is a schematic block diagram showing an example of the spurious radiation preventing circuit 321. The spurious radiation preventing circuit 321 is a circuit for effectively preventing a spurious radiation component from feeding through the signal line 32 from the digital circuit or microcomputer 30 to the output device 50.

In structure, an output of the digital circuit or microcomputer 30 is connected to the signal line 32. The signal line 32 is connected to an emphasis network EN and also connected to an adder circuit AD. The emphasis network EN is a circuit for emphasizing a high frequency component of a pulse signal (digital signal), for example, withdrawn from the signal line 32 as shown in FIG. 5, the output therefrom being applied to the other input of the adder circuit AD. The adder circuit AD adds the two applied signals, that is, an original signal and an emphasized signal, in a superimposed manner and provides the added output to a current booster circuit IB. The current booster circuit IB includes an emitter follower circuit, or the like, and the output therefrom is applied to a high-cut filter HCF. The high-cut filter HCF appropriately removes or cuts the previously emphasized high frequency components. Since the high frequency component of the signal was previously emphasized, a signal having almost the same waveform as that of the original signal is obtained at signal line 32a even if the signal passes through the high-cut filter HCF. Since the signal 32a is connected to the output device 50, the output device 50 can receive a signal in which a high frequency component is attenuated or cut so that the signal comprises approximately the same waveform as the original signal.

In the embodiment of FIG. 5, since a spurious high frequency component from the signal line 32 is blocked by the above described high-cut filter HCF, such a spurious high frequency component is never fed to the signal line 32a. Therefore, spurious components are not radiated from the signal lines 32, 32a acting as antennas.

In a conventional case where the emphasis network EN and an adder circuit AD are not provided and only the filter HCF is interposed, a wave shape as shown by a dotted line in FIG. 5 is obtained, which means that the quality of a signal to be transmitted is remarkably deteriorated. On the other hand, in the present embodiment, a digital signal having substantially the same quality as that of the original signal can be obtained even after passing through a high-cut filter HCF for removing high frequencies, by emphasizing a high frequency component in advance and feeding the emphasized components with as low an impedance as possible.

Figure 6:
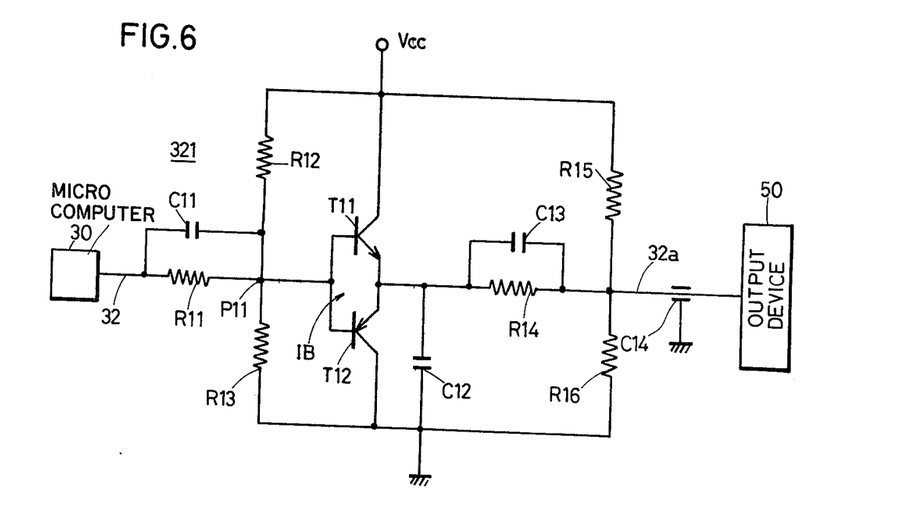
FIG. 6 is a circuit diagram of an essential part showing a preferred example in accordance with the embodiment of FIG. 5.

FIG. 6 is a circuit diagram of an essential part showing a preferred example embodiment of FIG. 5. A capacitor C11 and a resistor R11 comprise an emphasis network and are connected to a signal line 32. The resistor R11 transmits the original signal sent out to the signal line 32 to a node P11 comprising an adder circuit in a subsequent stage. Accordingly, the summing point P11 adds the emphasized component differentiated by the capacitor C11 and the original signal in a superimposed manner. The sum signal obtained in the summing point P11 is applied to a current booster IB. The current booster IB includes a differential amplifier which comprises a pair of transistors T11 and T12. Thus, the current booster IB includes an emitter follower type of complementary circuit. The bases of the transistors T11 and T12 are commonly connected to the summing point P11 and the emitters thereof are commonly connected to the signal line 32a. The collector of the transistor T11 is connected to the power supply Vcc and the collector of the transistor T12 is connected to the ground. The resistors R12 and R13 connected to the bases of the transistors T11 and T12 determine the bias of these transistors and also determine a charge-discharge time constant of a differential capacitor in cooperation with the input impedances of these transistors. Accordingly, in consideration of the foregoing, these resistors R12 and R13 need be selected so as to have suitable values, however, these may also be omitted, depending on the situation. The capacitor C12 interposed between each of emitters of the transistors T11 and T12 and the ground is a capacitor for preventing an overshoot, such as is used in a usual emitter follower circuit. These resistors R15 and R16 can also be omitted if desired.

A parallel connection of the capacitor C13 and the resistor R14 is interposed in the signal line 32a, the capacitor C13 and resistor R14 constituting an impedance matching circuit together with a resistor R15. A resistor R16 interposed between the signal line 32a and the ground is a biasing resistor. The reflection of a signal from a terminated end of the signal line 32a can be effectively prevented by properly selecting the value of the impedance matching circuit, and hence the high-fidelity transmission of a signal waveform becomes possible.

The signal line 32a passes through a feed-through capacitor C14 to be connected to the output device 50. The feed-through capacitor C14 constitutes a high frequency component removing filter, the outer electrode thereof being grounded. Thus, a high frequency component is removed or attenuated by the feed-through capacitor C14 and, as a result, a spurious component can be effectively prevented from being radiated from the signal line 32a. As described in the foregoing, even if such a high frequency component is cut or attenuated, a waveform that is approximately the same as the original signal is applied to the output device 50 from the signal line 32a.

In the above described embodiments in FIG. 5 and FIG. 6, it is possible to omit the current booster IB. In addition, many more emphasis networks may be optionally provided as necessary, that is, in accordance with the amount of attenuation caused by a high-cut filter HCF.

Figure 7:
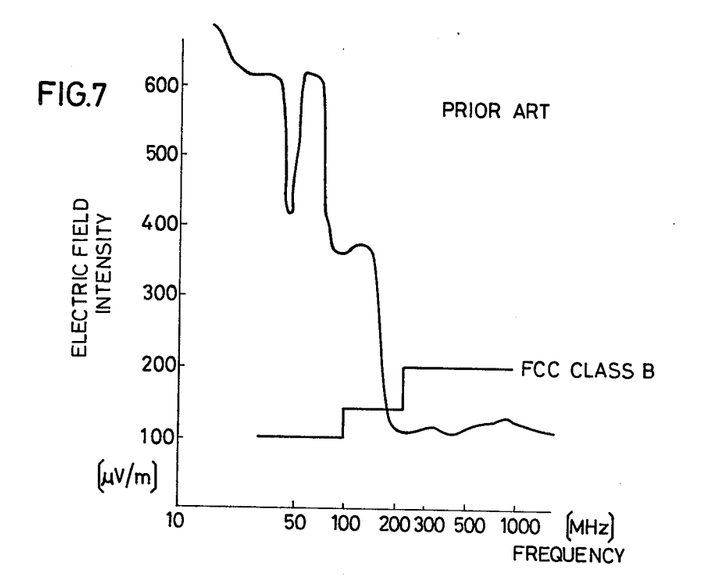
Figure 8:
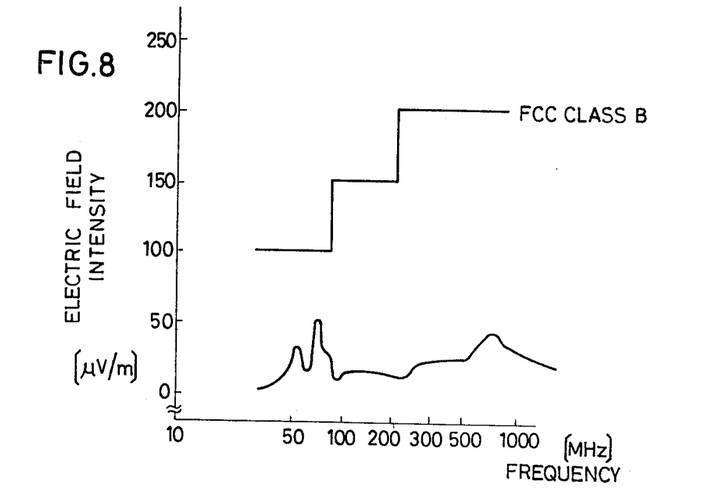
Figure 9:
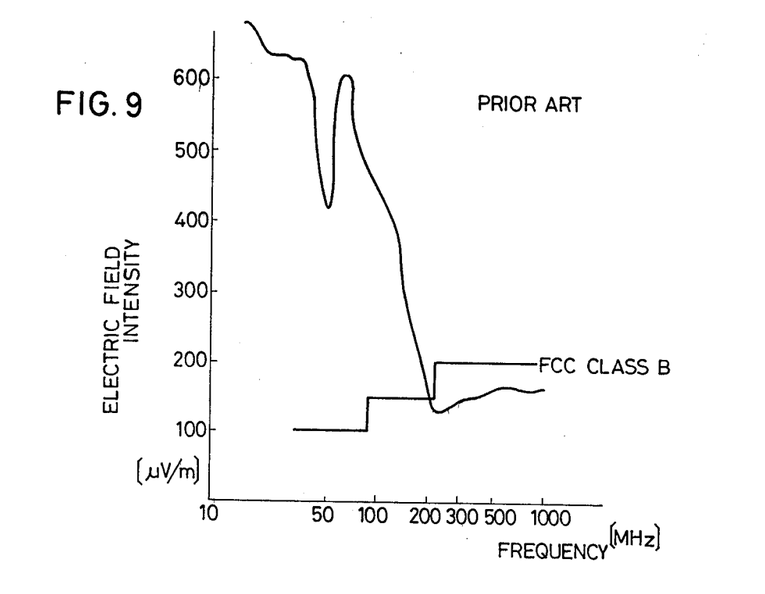
Figure 10:
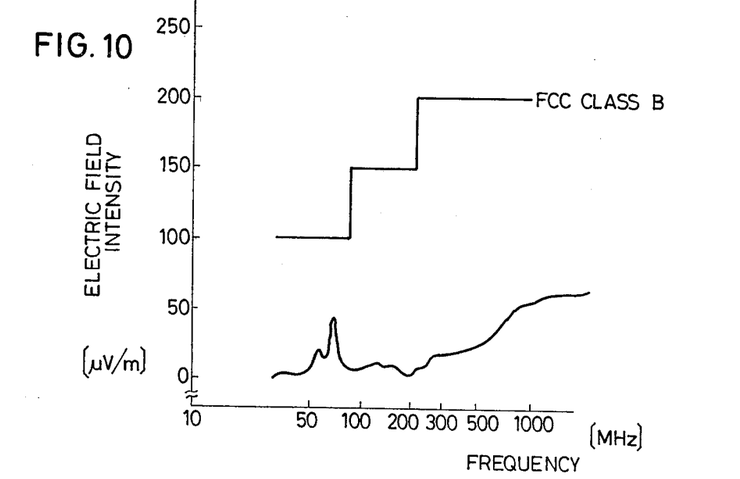

FIGS. 7 to 10 show graphs for explaining meritorious effects of the present invention, wherein the abscissas indicate frequency and the ordinates indicate the intensity the radiated electric field at a point three meters away from the apparatus. FIGS. 7 and 8 show a horizontally polarized component and FIGS. 9 and 10 show a vertically polarized component. FIGS. 7 and 9 show, respectively, an example wherein no approach for preventing spurious radiation is taken in the apparatus as shown in FIG. 1. FIGS. 8 and 10 show, respectively, the cases where the above described embodiments are applied. As seen in FIGS. 7 to 10, as compared with the case where no steps for preventing spurious radiation are taken, in the case where the above described embodiments are applied, the rather strict limit value imposed by the FCC for class B can be sufficiently satisfied by the present teaching.

In a certain example embodiment wherein a digital circuit includes a signal containing the components of 60 Hz to 300 kHz, the values of the other elements may be set as follows: R1=50Ω, C1=860 pF, C2=390 pF, T1=2SC1740, and T2=2SA937 in the embodiment of FIG. 4. In the embodiment of FIG. 6, C11=30 pF, R11=1kΩ, R12 and R13 are omitted, C12=390 pF, C13=0.2 μF, R14=22Ω, R15=68Ω, R16 is omitted, C14=2200 pF, T11=2SC1740, and T12=2SA937.

The above described embodiments are mainly directed to the cases in which a signal to be transmitted is a digital signal. However, the idea of the present invention is applicable to the case in which an analog signal such as a video signal is transmitted.

Figure 11:
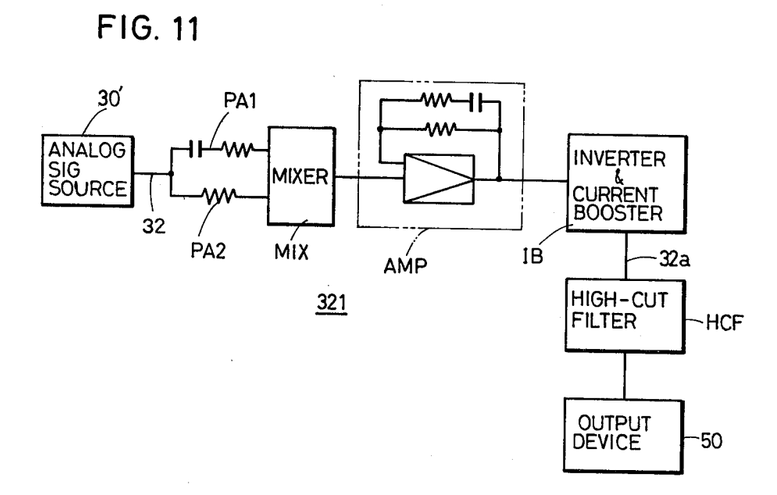
FIG. 11 is a schematic diagram showing an example of a spurious radiation preventing circuit 321 in the case in which a signal to be transmitted is an analog signal.

FIG. 11 is a block diagram showing another example of the spurious radiation preventing circuit 321. The embodiment of FIG. 11 is an example wherein an analog signal such as a television signal is applied to the output device 50 using signal lines 32 and 32a. The analog signal sent out to the signal line 32 from an analog signal source 30' is applied to a mixer MIX through paths PA1 and PA2 which are different in their frequency response characteristic with respect to each other. Accordingly, the mixer MIX adds analog signals passing through the paths PA1 and PA2 having different frequency response characteristics and applies the added output to an input of an amplifier AMP. The amplifier AMP is a circuit for further amplifying the analog signals from the mixer MIX, the high frequency components thereof being emphasized, and includes a feedback loop having a predetermined frequency response characteristic. By properly adjusting the frequency response characteristic of the amplifier AMP through the feedback loop, the high frequency components can be emphasized by any amount corresponding to the attenuation amount caused by the high-cut filter HCF in the latter stage. The output from the amplifier AMP is applied to the signal line 32a through an inverter and a current booster IB. The inverter is needed in those cases in which the polarity is inverted by the amplifier AMP and the current booster IB is the same as the previous current booster in FIGS. 5 and 6. The outputs from the inverter and the current booster IB are connected to the signal line 32a which is connected to the output device through the high-cut filter HCF. The manner in which a spurious component can be effectively prevented from being radiated from the signal line 32a by the high-cut filter HCF is the same as in the embodiments described above. In this case, by means of the paths PA1, PA2 and the mixer MIX and the amplifier AMP, the signal component, in a frequency band attenuated by the filter HCF, is relatively emphasized as compared with signal components of other frequencies and hence, an analog signal that is approximately the same as the original analog signal is applied to the output device 50 through the output line 32a even if a high frequency component is cut or attenuated by the high-cut filter HCF.

Figure 12:
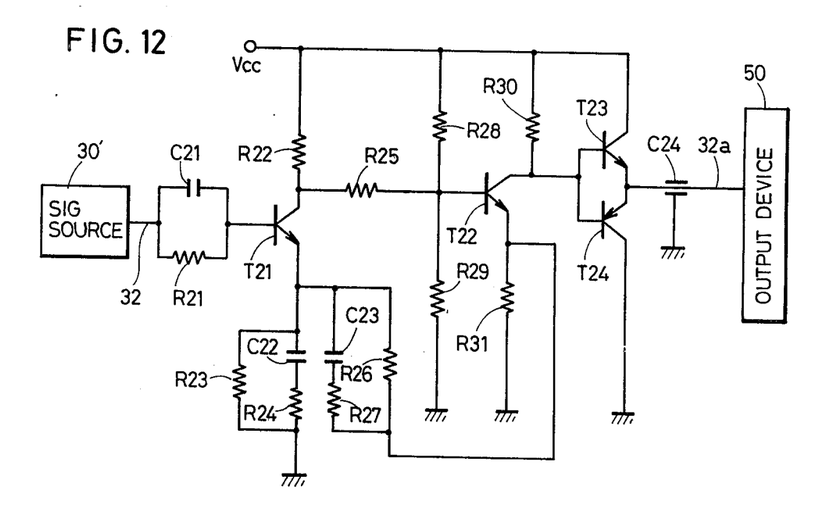
FIG. 12 is a circuit diagram of an essential part showing a preferred example in accordance with the embodiment of FIG. 11.

FIG. 12 is a circuit diagram showing a preferred embodiment of FIG. 11. In the structure, a capacitor C21 and a resistor R21 constitute paths having different frequency responses. The parallel circuit of this capacitor C21 and resistor R21 is connected between the base of a transistor T21 included in an amplifier and the signal line 32. Accordingly, to the input of the transistor T21 are applied the sum of the analog signals passing through the paths having different frequency response characteristics. The collector of the transistor T21 is connected to the power source Vcc through a resistor R22 and also connected through a resistor R25 to the base of a transistor T22 constituting an inverter. The emitter of the transistor T21 is connected to the ground through an impedance circuit comprising resistors R23 and R24 and a capacitor C22. The input impedance viewed from the base of the transistor T21 is caused to be different by the impedance circuit, depending on the frequencies. More particularly, in the case of lower frequency components, the input impedance is determined based on the resistor R23 and in the case of higher frequency components the input impedance is determined based on the resistors R23 and R24. Accordingly, at the output of the transistor T2 constituting an amplifier, high frequency components are withdrawn as a higher voltage as compared with those in the lower frequency components. More particularly, high frequency components are emphasized at that point. The biasing point for the transistor T21 is determined by the resistor R22 and the impedance circuit. The transistor T22 constituting an inverter is adapted such that the operating bias thereof is determined by the related resistors R28, R29, R30 and R31. Since the polarity of the analog signal is inverted by the amplifier, that is, the transistor T21, the polarity is again inverted by the inverter T22 so that the same polarity as that of the original signal is obtained. The bases of the transistors T23 and T24 constituting a current booster are commonly connected to the collector of the inverter transistor T22. A feedback loop comprising resistors R26, R27 and a capacitor C23 and having a predetermined frequency characteristic, is connected between an emitter of the inverter transistor T22 and the emitter of the transistor T21 in the amplifier. The signal line 32a is commonly connected to each of emitters of the transistors T23 and T24 in the current booster and passes through a feed-through capacitor C24 constituting a high-cut filter and then is connected to the output device 50. The operation of the FIG. 12 embodiment is omitted since it can be easily understood from the description related to the previous embodiment of FIG. 11.

Figure 13:
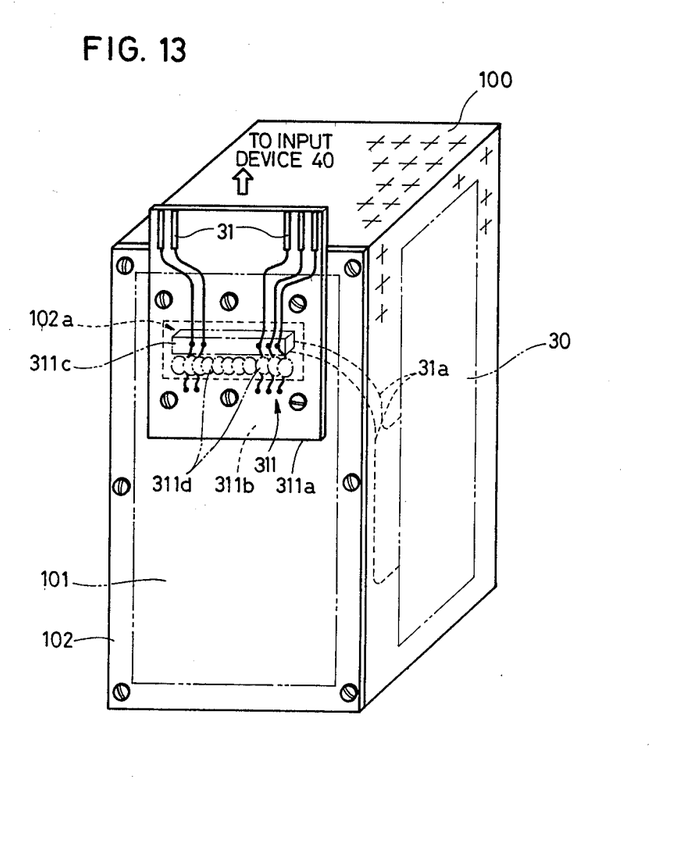
FIG. 13 is a schematic perspective view showing the other embodiment of the present invention.

FIG. 13 is a schematic perspective view showing another embodiment of the present invention. The present embodiment shown is effectively applied to a spurious radiation preventing circuit inserted in the signal line connected between the signal processing circuit 30 and the input device 40. The circuit 30 is housed in the shielded casing 100 which has an open portion 101 at one side thereof. The open portion 101 is covered by a metallic plate 102 fixed to the casing 100 with screws. The metallic plate 102 has an open portion 102a which is covered by a printed circuit board 311a fixed to the plate 102 with screws. The printed circuit board 311a serves as a base board of the spurious radiation preventing circuit 311, which is a two-sided printed board having a grounded pattern 311b surrounding a portion where a connector 311c is attached. The connector 311c serves as a connecting terminal between the signal line 31a connected to the circuit 30 and the signal line 31 connected to the input device. Thus, an input signal (ON/OFF signal) from the input device 40 is applied to the circuit 30 through the signal line 31, the connector 311c and the signal line 31a. A feature of the embodiment resides in that capacitors 311d are connected between terminals of the connector 311c and the grounded pattern 311b. The capacitors 311d serve as a high-cut filter for attenuating a high frequency component in the signal from the input device 40 to the circuit 30, whereby the high frequency component is bypassed to the ground potential. Thus, a spurious high frequency component is effectively prevented from being radiated from the signal line 31.

The embodiment of FIG. 13 is useful in preventing spurious radiation which occurs in the signal path where a relatively low frequency signal such as an ON/OFF signal from a manually operated switch (not shown) is propagated.

Although the present invention has been described and illustrated in detail, it is clearly understood that the same is by way of illustration and example only and is not to be taken as any limitation, the spirit and scope of the present invention being limited only by the terms of the appended claims.

What is claimed is:

1. A system for transmitting a desired signal component of an original signal having relatively high frequency components from a signal source to a further device and for simultaneously preventing the transmission of undesired high frequency components, comprising signal line means for withdrawing said original signal from said signal source, emphasizing network means coupled to said signal line means for emphasizing undesired high frequency components of said original signal, signal attenuating circuit means operatively connected to said emphasizing network means for attenuating emphasized high frequency signal components from said emphasizing network means, wherein said emphasizing network means comprises means for producing an emphasized signal component based on said original signal, and means for adding, in a superimposed manner, said emphasized component from said emphasized component producing means to said original signal to form a superimposed signal, whereupon said attenuating circuit means remove the emphasized signal component from said superimposed signal and wherein said means for producing an emphasized signal component of said emphasizing network means comprises signal paths having different frequency response characteristics with respect to each other, at least one of said signal paths comprising amplifier means including an impedance circuit for providing different input impedances in accordance with different frequency components, said amplifier means including a feedback loop having a predetermined frequency response characteristic.

2. The system of claim 1, wherein said signal comprises a rising edge and a falling edge having a ramp, and wherein said emphasized component producing means of said emphasizing network means includes differentiating circuit means for differentiating at least one of said rising edge and falling edge of said signal.

3. The system of claim 1, wherein said attenuating circuit means comprises capacitor means interposed between a signal line in a stage of said amplifier circuit means and a reference potential.

4. A spurious radiation preventing apparatus for suppressing spurious radiation from an electronic circuit generating such spurious radiation, comprising a shielded casing having an opening said electronic circuit being housed in said shielded casing, a printed circuit board having a conduction pattern and covering said opening of said shielded casing, circuit means formed on said printed circuit board for preventing spurious high frequency components from leaking out of said electronic circuit, signal lines for connecting said circuit means to said electronic circuit, means for connecting said electronic circuit with an external circuit, wherein said conduction pattern comprises a pattern connected to ground potential, and wherein said circuit means further comprises capacitor means connected between said signal line and said pattern connected to ground potential.

* * * * *